US008486589B2

United States Patent
Hsu et al.

(10) Patent No.: US 8,486,589 B2
(45) Date of Patent: Jul. 16, 2013

(54) LITHOGRAPHIC PROCESSING METHOD, AND DEVICE MANUFACTURED THEREBY

(75) Inventors: Duan-Fu Stephen Hsu, Fremont, CA (US); JooByoung Kim, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/455,103

(22) Filed: Apr. 24, 2012

(65) Prior Publication Data

US 2012/0208113 A1   Aug. 16, 2012

Related U.S. Application Data

(62) Division of application No. 12/567,514, filed on Sep. 25, 2009, now Pat. No. 8,182,969.

(60) Provisional application No. 61/100,544, filed on Sep. 26, 2008.

(51) Int. Cl.
 *G03F 1/44* (2012.01)

(52) U.S. Cl.
 USPC .................. 430/5; 430/30; 716/50; 716/53

(58) Field of Classification Search
 USPC ...................... 430/5, 30; 716/50, 53
 See application file for complete search history.

(56) References Cited

U.S. PATENT DOCUMENTS

| 7,879,537 B1 | 2/2011 | Rigby et al. |
| 2009/0217224 A1 | 8/2009 | Wiaux et al. |

*Primary Examiner* — Christopher Young
(74) *Attorney, Agent, or Firm* — Pillsbury Winthrop Shaw Pittman LLP

(57) ABSTRACT

A method of splitting a lithographic pattern into two sub-patterns, includes generating test structures corresponding to structures of interest in the lithographic pattern, varying the test structures through a selected range of dimensions, simulating an image of the test structures, determining an image quality metric for the simulated image, analyzing the determined image quality metric to determine pitch ranges for which split improves the image quality metric and ranges for which split does not improve the image quality metric, and generating the two sub-patterns in accordance with the determined pitch ranges.

14 Claims, 26 Drawing Sheets

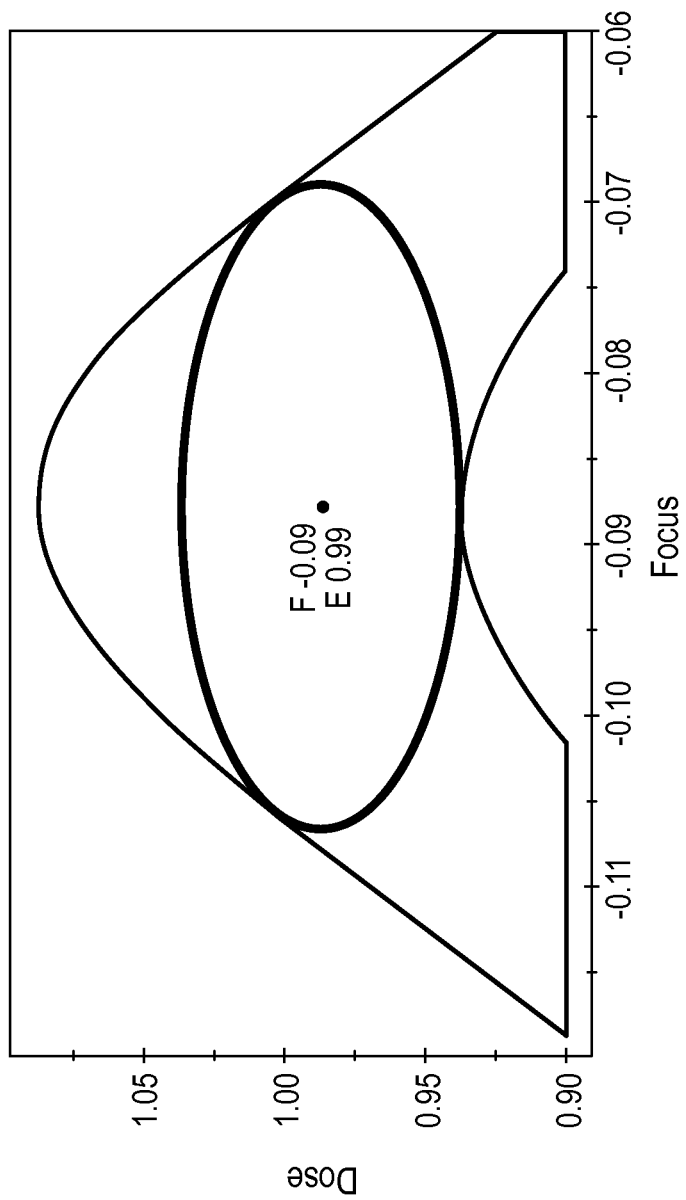

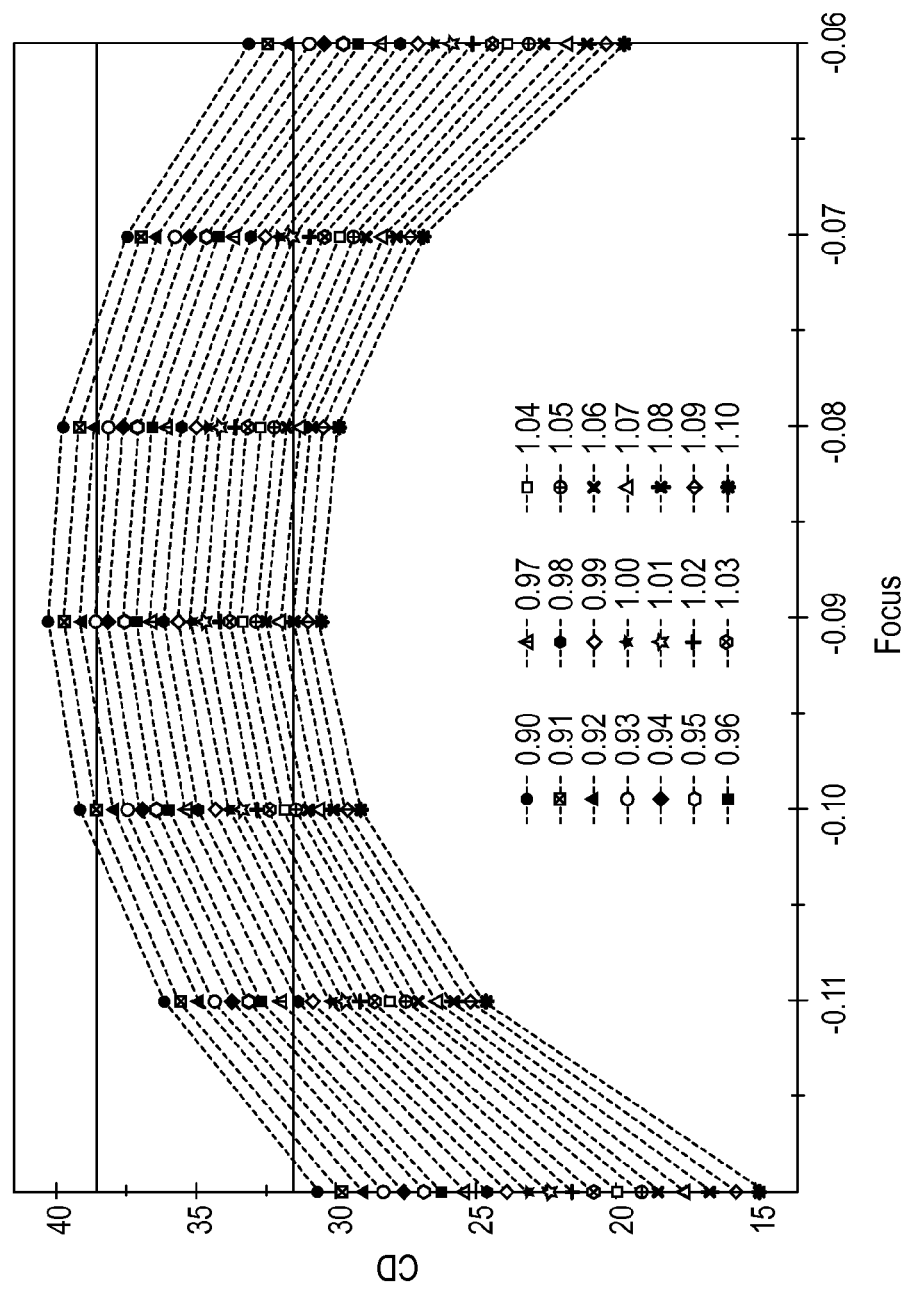

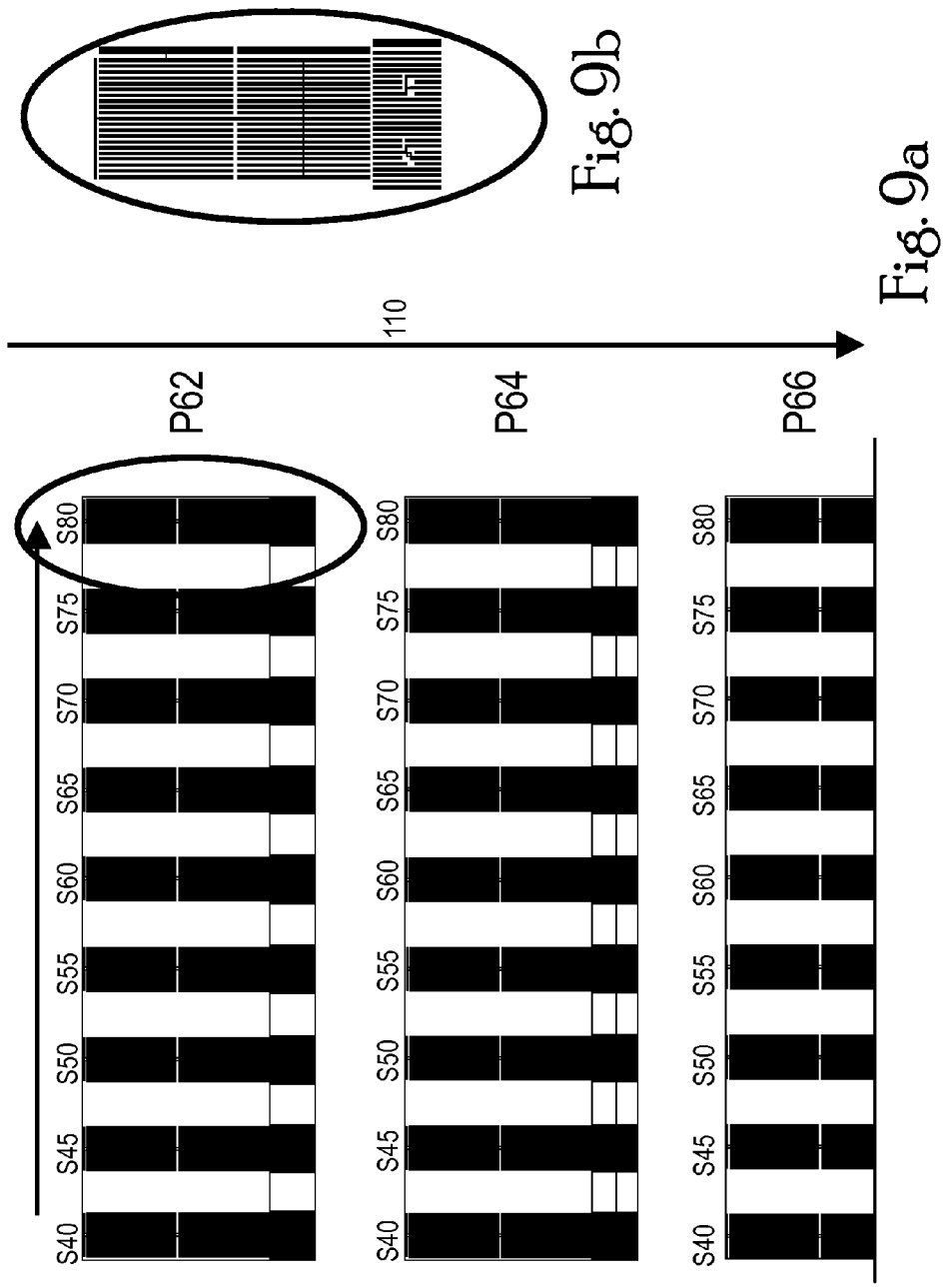

LITHOGRAPHIC PROCESSING METHOD, AND DEVICE MANUFACTURED THEREBY

CROSS-REFERENCE TO RELATED APPLICATIONS

This application is a divisional of U.S. patent application Ser. No. 12/567,514, filed on Sep. 25, 2009, which claims priority to U.S. Provisional Patent Application No. 61/100,544, filed on Sep. 26, 2008, the contents of which are incorporated herein by reference in their entirety.

FIELD OF THE INVENTION

The present invention relates generally to a lithographic apparatus and more particularly to a method of exposure using multiple exposures.

DESCRIPTION OF THE RELATED ART

A lithographic apparatus is a machine that applies a desired pattern onto a target portion of a substrate. The apparatus generally comprises a radiation system for supplying a beam of radiation, a support structure for supporting a patterning device, the patterning device serving to pattern the beam, a substrate table for holding a substrate, and a projection system for projecting the patterned beam of radiation onto a target portion of the substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers or stepper/scanners, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system." The radiation system may also include components operating according to any of these design types for directing, shaping or controlling the projection beam of radiation, and such components. The radiation system as well as the projection system generally comprises components for directing, shaping or controlling the projection beam of radiation. Generally, the projection system comprises means to set the numerical aperture (commonly referred to as the "NA") of the projection system. For example, an adjustable NA-diaphragm can be present in a pupil of the projection system. The radiation system typically comprises adjusting means for setting the outer and/or inner radial extent (commonly referred to as σ-outer and σ-inner, respectively) of the intensity distribution upstream of the mask (in a pupil of the radiation system).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

A circuit pattern corresponding to an individual layer of an IC device generally comprises a plurality of device patterns and interconnecting lines. Device patterns may comprise features of different spatial arrangement such as, for example, line-space patterns ("bar patterns"), capacitor contact patterns, patterns of contact holes and DRAM isolation patterns. A feature is not necessarily characterized by a shape whose line elements define a closed contour. For example, a spatial arrangement of extremities of two neighboring features and a space between the two extremities may also, in the context of the present text and claims, be referred to as a feature.

In the context of the present text and claims, sizes of features are referred to as those sizes that the features nominally have at substrate level. At a mask, the size of a feature is M times larger than the nominal size, where M is the magnification of the projection system (typically, $|M|=¼$ or $⅕$). Generally, additional size deviations at the mask are introduced to compensate for errors occurring, for example, during projection and exposure of a pattern; such a re-sizing of features of the sub-pattern is referred to hereinafter as biasing and/or Optical Proximity Correction ("OPC"). An amount of biasing and/or OPC is also commonly expressed in terms of a corresponding, nominal amount of re-sizing at substrate level. The noun "target" when used in expressions such as "target features" is indicating that these features have substantially a nominal size as desired for the device layer.

Fabrication of a circuit pattern involves the control of space tolerances between features, interconnecting lines, and between elements of a feature as well as the control of the size of features and feature elements. With increasing demands on the number of features per area of die to be printed, resolution enhancement techniques have been developed to improve the resolution limit obtainable with a lithographic processing method using a projection lithography apparatus. The smallest space between two lines permitted in the fabrication of a device layer and/or the smallest width of a line or of any other feature such as, for example, a contact hole, is referred to as the critical dimension ("CD"). Features comprising a minimum size substantially equal to the CD are referred to as "CD-sized features" in the present text.

Optimal performance of a lithographic processing method and usage of the lithographic projection apparatus at its ultimate resolution are generally required for the lithographic processing of patterns comprising arrays of CD-sized features (such as for example contact holes) spaced apart at a distance substantially equal to the CD. For such arrays of features a pitch P of the periodicity can be defined, which then in this case is substantially equal to twice the CD. A pitch whereby $P=2$ CD is the minimum pitch at which CD-sized features can be arranged for printing with a lithographic processing method. The layer may also comprise CD-sized features positioned in one or more arrays at a pitches larger than 2 CD. In particular, the printing of layers comprising CD-sized contact holes occurring at both minimum pitch and larger pitches is of importance and can involve state-of-the-art resolution enhancement measures. Generally, features separated with a line to space ration of 1:1 to 1:4 are considered to be "dense features," while features separated by a distance greater than about 10 times the imaging wavelength are considered to be "isolated features." However, there is no commonly accepted exact definition of "dense features;" neither is there a commonly accepted exact definition of "isolated features."

Further, the concept of pitch in the present text and claims also applies to clusters of at least two features, in which case "pitch" refers to the mutual distance between two corresponding points of two substantially similar neighboring features.

The resolution limit of the projection apparatus is one of the characteristics determining the CD obtainable with a lithographic manufacturing process. This resolution limit is generally dictated by the NA of the projection system and the wavelength of the radiation of the projection beam, along with a process constant, $k_1$, that varies according to the particular process being used. The conventional approach to enhance resolution is to increase the NA and to reduce the wavelength. These measures have as side effect that depth of focus and insensitivity to residual errors in exposure dose of irradiated target portions become small. The combined usable depth of focus and allowable variance of exposure dose for a given tolerance in the size CD of a target design feature as processed is usually referred to as process latitude. Preferably resolution enhancement measures should not affect process latitude, and therefore minimum required and obtainable process latitude is presently another characteristic determining the smallest CD obtainable with a lithographic manufacturing process.

One approach to this problem is the use of double patterning techniques (DPT). In this approach, a dense pattern is split up in two or more partial patterns of less densely packed features.

SUMMARY OF THE INVENTION

One aspect of embodiments of the present invention provides a method of splitting a lithographic pattern into a plurality of sub-patterns, including generating at least one test structure corresponding to one or more structures of interest in the lithographic pattern, varying the at least one test structure through a selected range of dimensions to produce a plurality of varied test structures, determining a plurality of values for an image quality metric for images of the plurality of varied test structures, analyzing the values to determine ranges of dimensions for which a pattern split would improve the image quality metric, and generating a plurality of sub-patterns of the lithographic pattern in accordance with the determined ranges.

Given a desired pattern, the applicability of a double exposure process when run on a given lithographic apparatus and based on splitting the desired pattern in two sub-patterns with features less dense than the features of the desired pattern, can be assessed in terms of a process latitude minimally required for the printing of each sub-pattern. In general, a process latitude enabling the printing of a pattern depends on parameters comprising the characteristics of the desired pattern (such as the CD and the range of pitches at which CD-sized features occur in the desired pattern), the characteristics of the lithographic apparatus in use (such as the illumination mode, the wavelength of the patterned beam, the maximum numerical aperture of the projection system), and the characteristics of the pattern provided to the reticle (for example, a binary pattern or an attenuated Phase Shift pattern). Therefore, when process latitude is used as criteria for enabling of printing, and different lithographic processes are compared, these characteristics should be accounted for.

Aspects of embodiments of the invention may include a computer-readable medium encoded with computer-executable instructions for performing the foregoing method or for controlling the a lithographic system in accordance with the foregoing method.

Aspects of embodiments of the invention may include a lithography or litho cell system configured and arranged to be operated in accordance with the foregoing method. Such a system may incorporate, for example, a computer programmed to allow a user to control the device in accordance with the method, or other methods.

Aspects of embodiments of the invention may include a simulation system configured and arranged to be operated in accordance with the foregoing method.

Aspects of embodiments of the invention may include a method for manufacturing a mask in accordance with the foregoing method and including designing a pattern for a mask, in accordance with the foregoing splitting method and writing a pattern for at least one mask in accordance with the determined splitting rules.

Aspects of embodiments of the invention may include a method of manufacturing a microelectronic device using a pattern derived according to the foregoing splitting method.

Aspects of embodiments of the invention may include a device manufactured in accordance with the foregoing method.

Aspects of embodiments of the invention may include a method including imaging a pattern split in accordance with the foregoing method.

A device pattern comprising a plurality of features can be decomposed into two sub-patterns using a design rule check or graph theory algorithm. Such algorithms are available in electronic design automation software which is used for design evaluation and modification, e.g., for optical proximity correction. Such decomposition algorithms are of use with the present invention when the mutual distance between any two neighboring features of the device pattern is at least a critical dimension CD, and the mutual distance between any two neighboring features in the first and second sub-pattern obtained after decomposition is at least twice the critical dimension CD. This increase of mutual distance enables an expansion of sub-pattern features on top of a re-sizing in view of biasing and/or OPC without violating a limit to the minimum absorber width between two transmissive sub-pattern features. This minimum width is determined by mask fabrication technology. Presently widths of the order of 80-100 nm (at mask level) are feasible. Alternatively the increase of mutual distance can be exploited for placement of assist features (i.e., features which do not print such as scatter bars) to provide further Optical Proximity Correction, whereas such placement would not have been possible in the desired pattern due to lack of space between neighboring features.

A device pattern comprising a plurality of features can be such that it is not possible to apply a decomposition into two sub-patterns in which both sub-patterns satisfy the condition that the mutual distance between any two neighboring features in the first and second sub-patterns obtained after decomposition is at least twice the critical dimension CD, whereas it is possible to obtain at least one sub-pattern satisfying the condition. In that situation, the one sub-pattern not satisfying the condition can be further split, and if necessary the splitting can be repeated until each obtained sub-pattern satisfies the condition. In that case an embodiment of the invention is not limited to a double exposure process, but includes a multi exposure process, whereby the number of exposures is in accordance with the number of sub-patterns obtained.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm).

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

DESCRIPTION OF THE DRAWINGS

Embodiments of the invention will now be described, by way of example only, with reference to the accompanying schematic drawings in which corresponding reference symbols indicate corresponding parts, and in which:

FIGS. 6a, 6b, 6c and 6d illustrate exposure latitude (focus v. CD and focus v. dose) for no split (130 nm pitch, 35 nm CD target) and split patterns (260 nm pitch, 35 nm CD target) respectively;

FIGS. 9a and 9b illustrate examples of test patterns for use in accordance with an embodiment of the invention;

DETAILED DESCRIPTION

Figure 1:
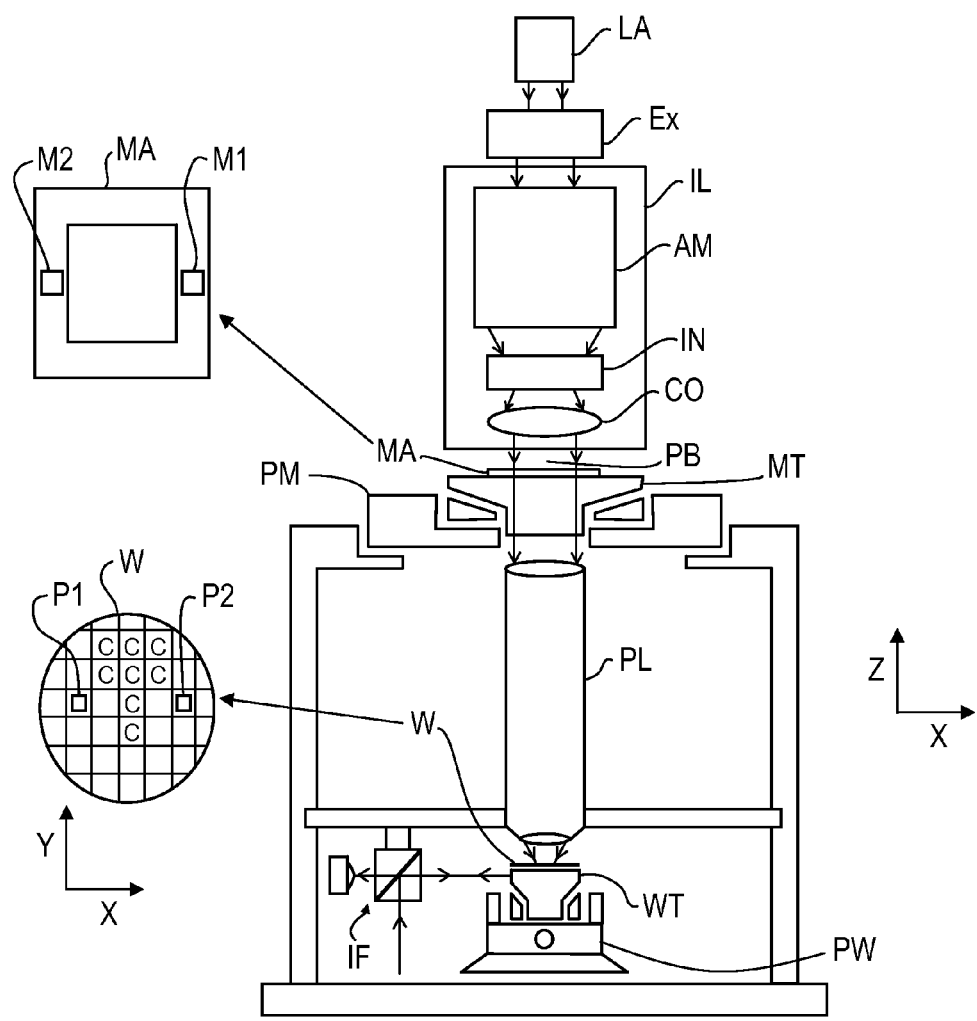
FIG. 1 depicts a lithographic projection apparatus according to an embodiment of the invention.

FIG. 1 schematically depicts a lithographic projection apparatus which may be used in the methods of the invention. The apparatus comprises:

a radiation system Ex, IL, for supplying a projection beam PB of radiation (e.g., UV radiation or DUV radiation of a wavelength of less than about 270 nm, such as wavelengths of 248, 193, 157, and 126 nm radiation). In this particular case, the radiation system also comprises a radiation source LA;

a first object table (mask table) MT provided with a mask holder for holding a mask MA (e.g., a reticle);

a second object table (substrate table) WT provided with a substrate holder for holding a substrate W (e.g., a resist-coated silicon wafer); and a projection system ("lens") PL (e.g., a quartz and/or $CaF_2$ lens system or a catadioptric system comprising lens elements made from such materials, either suitable for conventional imaging or suitable for imaging in the presence of an immersion fluid) for imaging an irradiated portion of the mask MA onto a target portion C (e.g., comprising one or more dies) of the substrate W.

As here depicted, the apparatus is of a transmissive type (i.e., has a transmissive mask). However, in general, it may also be of a reflective type, for example (with a reflective mask). Alternatively, the apparatus may employ another kind of patterning device, such as a programmable mirror array of a type as referred to above.

The source LA (e.g., a UV mercury arc lamp, or a DUV excimer laser) produces a beam of radiation. This beam is fed into an illumination system (illuminator) IL, either directly or after having traversed conditioning optics, such as a beam expander Ex, for example. The illuminator IL may comprise adjustable elements AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of positioner not explicitly depicted in FIG. 1 (and interferometers or linear encoder IF), the substrate table WT can be moved accurately, e.g., so as to position different target portions C in the path of the beam PB. Similarly, additional positioners (not explicitly depicted in FIG. 1) can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e., a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash." Instead, the mask table MT is movable in a given direction (the so-called "scan direction," e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As noted above, one approach to reducing an effective density of a pattern to be imaged is to use a design rule check algorithm to split the pattern into two sub-patterns, each having a relatively low density, such that the pitch of each pattern is greater than a capability of the lithography system to be used. Generally, such splits are performed on the basis of a rule or set of rules that determine, for each feature, to which sub-pattern that feature will belong. This may be referred to as "coloring" the pattern, because in certain implementations, features are colored red or blue depending on to which sub-pattern they are assigned. One example is a space-based rule wherein if two features are within a particular distance of each other, one feature will be colored red and the other blue, with all red features assigned to a first sub-pattern and all blue features assigned to a second sub-pattern.

Figure 2:
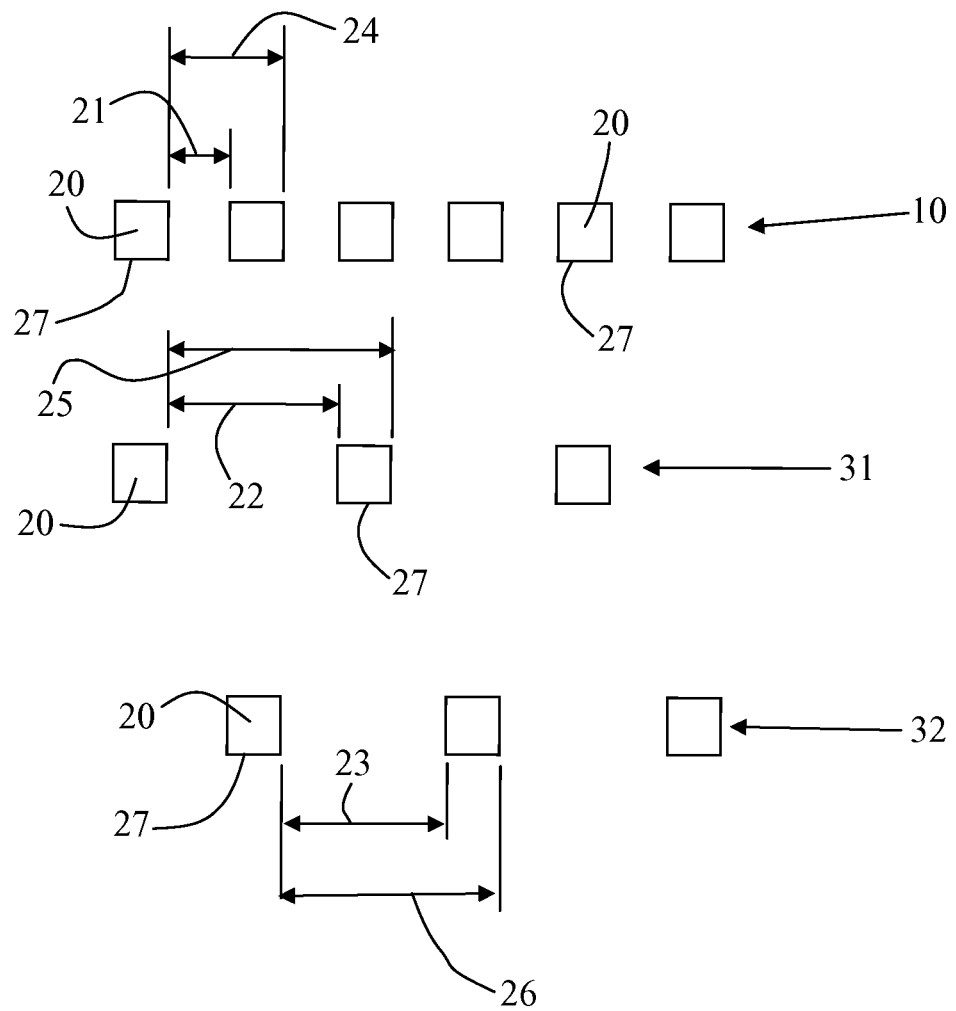
FIG. 2 depicts a device pattern comprising an array of square contact holes, and two sub-patterns.

In accordance with a prior art rule-based pattern split, illustrated in FIG. 2 a device layer with a desired pattern comprising a plurality of contact holes is printed using a 0.9 NA lithographic projection apparatus and 6% attenuating phase shift masks to pattern the projection beam, and using positive tone resist suitable for use with 193 nm wavelength of the projection beam radiation. In this approach, the device pattern comprises a linear array 10 of square contact holes 20 with sides 27, as shown in FIG. 2. The smallest dimension of each contact hole is the length of a side 27. In the example, this length is 90 nm corresponding to the critical dimension CD. In pattern 10 the contact holes are separated at least a distance CD as indicated by the arrow 21. The minimum pitch present in pattern 10 is denoted by P and indicated by the arrow 24 in FIG. 2. Here, P=2 CD. The pattern may further comprise contact holes 20 separated from any of the contact holes present in pattern 10 and from each other at a pitch larger than P. For simplicity, such contact holes are not shown.

Pattern 10 is split in a first and second sub-pattern 31 and 32 respectively, using a commercially available design check rule tool. The mutual distance between neighboring contact holes in the patterns 31 and 32 is indicated by arrows 22 and 23 whereby this distance is 3 CD. The patterns 31 and 32 have a pitch P1 and P2, respectively indicated by arrows 25 and 26. Here P1=P2=2 P=4 CD. So the pitch of the sub-patterns is relaxed by a factor 2.

Such a rule-based approach can result in one or both of the sub-patterns incorporating so-called forbidden pitches. For a given illumination setting, the forbidden pitch lies in the location where the field produced by the neighboring features interferes destructively with the field of the main feature. As a result, the application of pattern splitting may result in a lowering of ILS (image log slope).

Figure 3:
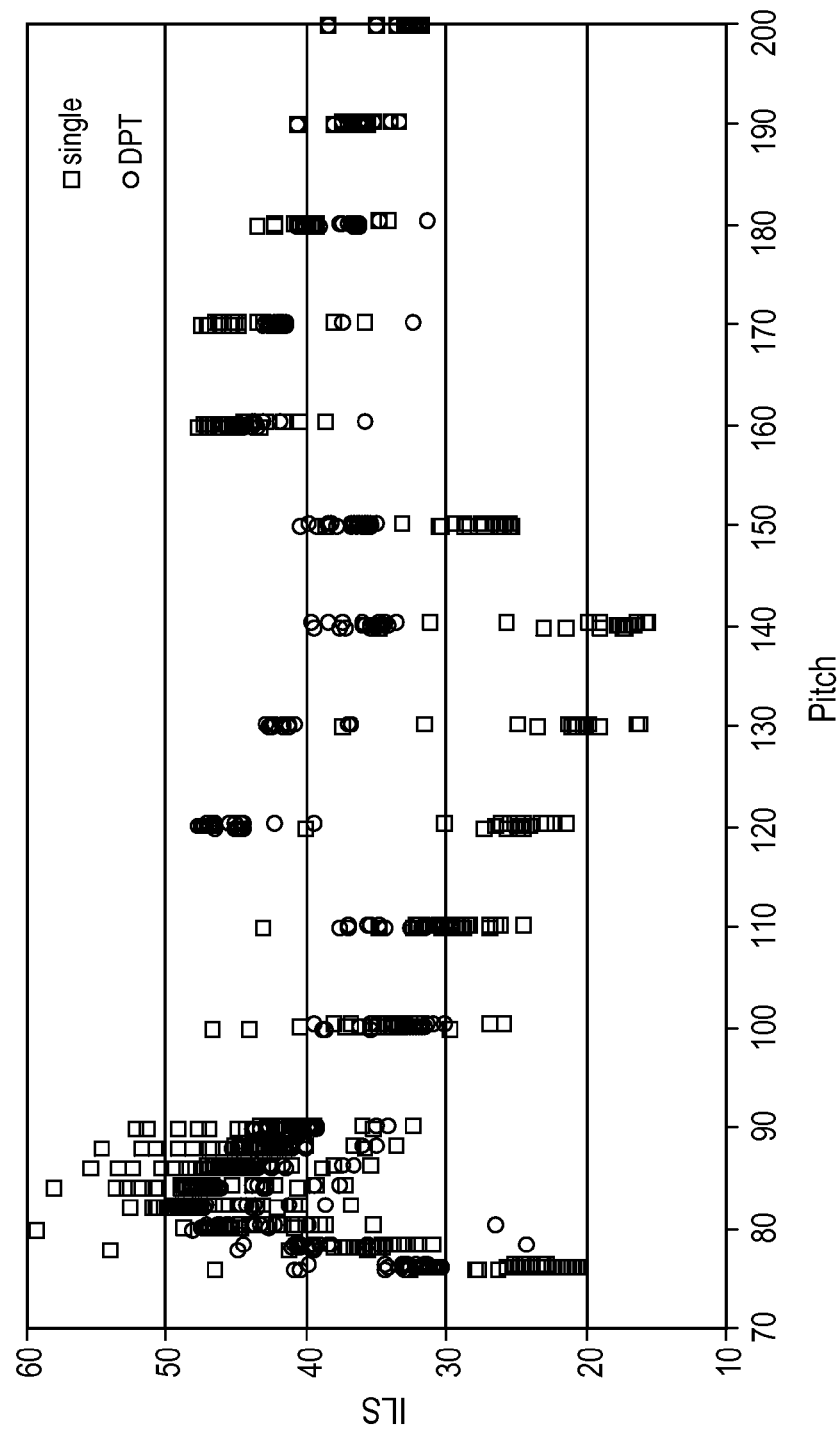
FIG. 3 shows the results from simulation of ILS using a single exposure versus splitting all pitches (DPT) for a variety of feature pitches.

FIG. 3 shows simulation data of ILS versus pitch illustrating the above described problem. The simulated illumination is a NA 1.35 cross quadrupole (C-quad) illumination pattern with $\sigma_{out}$=0.98 and $\sigma_{in}$=0.83. The applied rule is that feature pairs having pitch≦100 nm are split while features having pitch>100 nm are not.

In the Figure, ILS is plotted against pitch, and it can be seen that for certain pitches (e.g., 80-90 nm) there may be a decrease in ILS (i.e., image quality is diminished) relative to ILS for the split pattern (which would be imaging at 2P, or 160-180 nm). It can further be seen that for some pitches (e.g., 130-140 nm) that would not be split under the applied rule, there would have been an improvement in ILS if splitting were applied. As a result, the rule fails to achieve the best possible image quality given a particular pattern and imaging equipment.

Figure 4A:
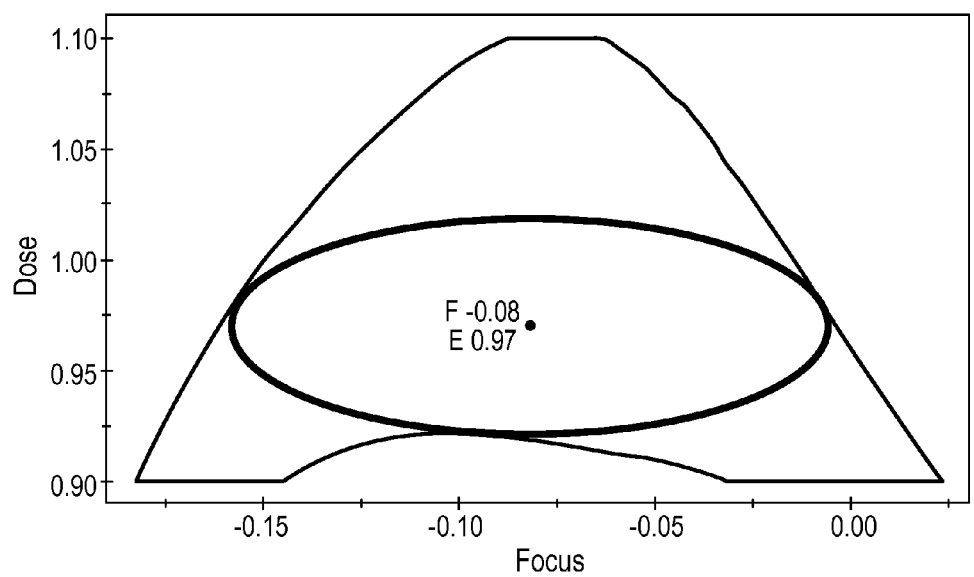
FIGS. 4a, 4b, 4c and 4d illustrate exposure latitude (focus v. CD and focus v. dose) for no split (90 nm pitch, 35 nm CD target) and split patterns (180 nm pitch, 35 nm CD target) respectively.
Figure 4B:
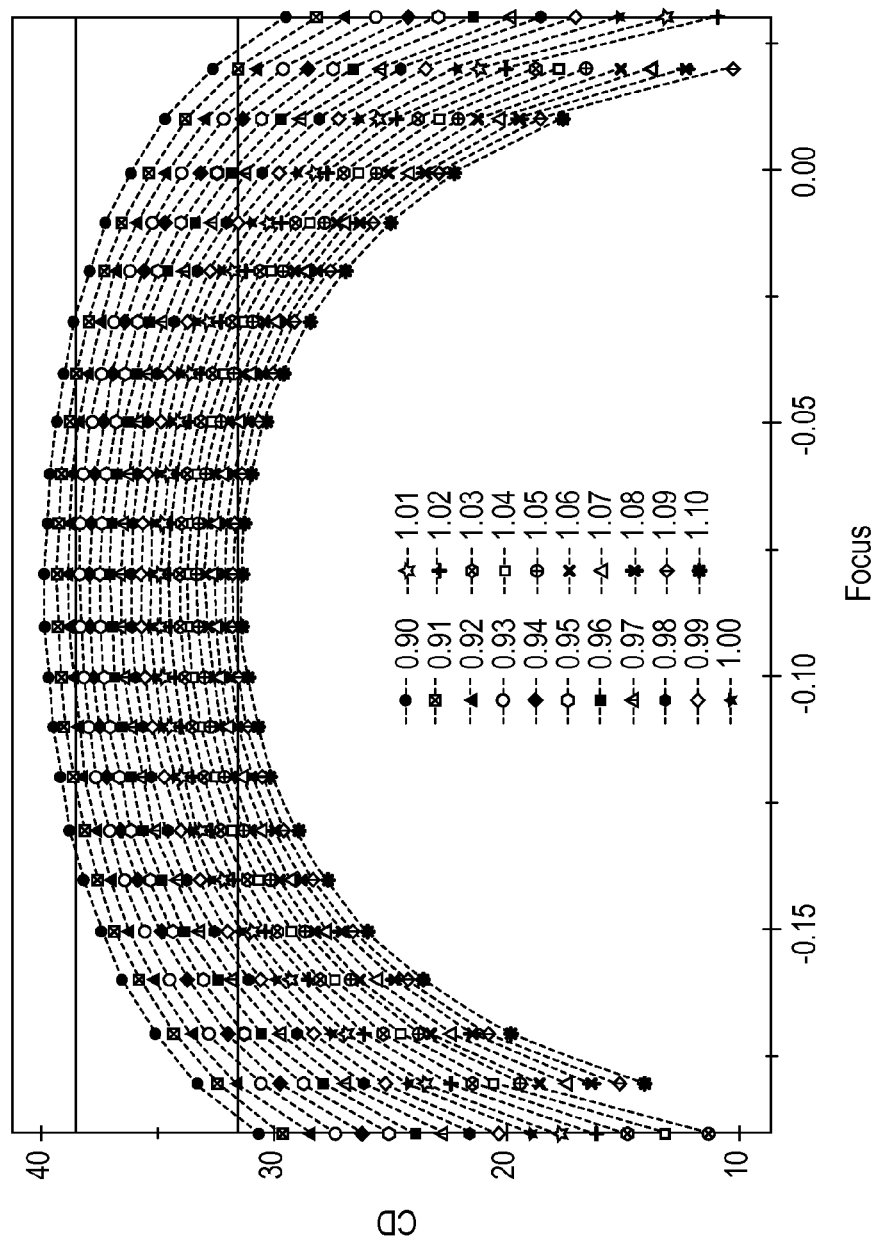
Figure 4C:
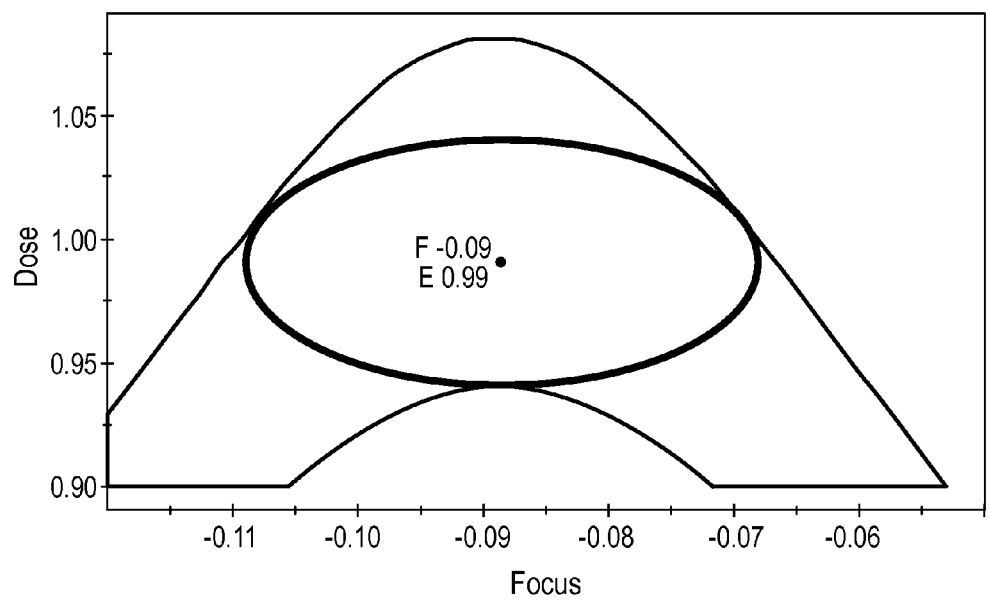
Figure 4D:
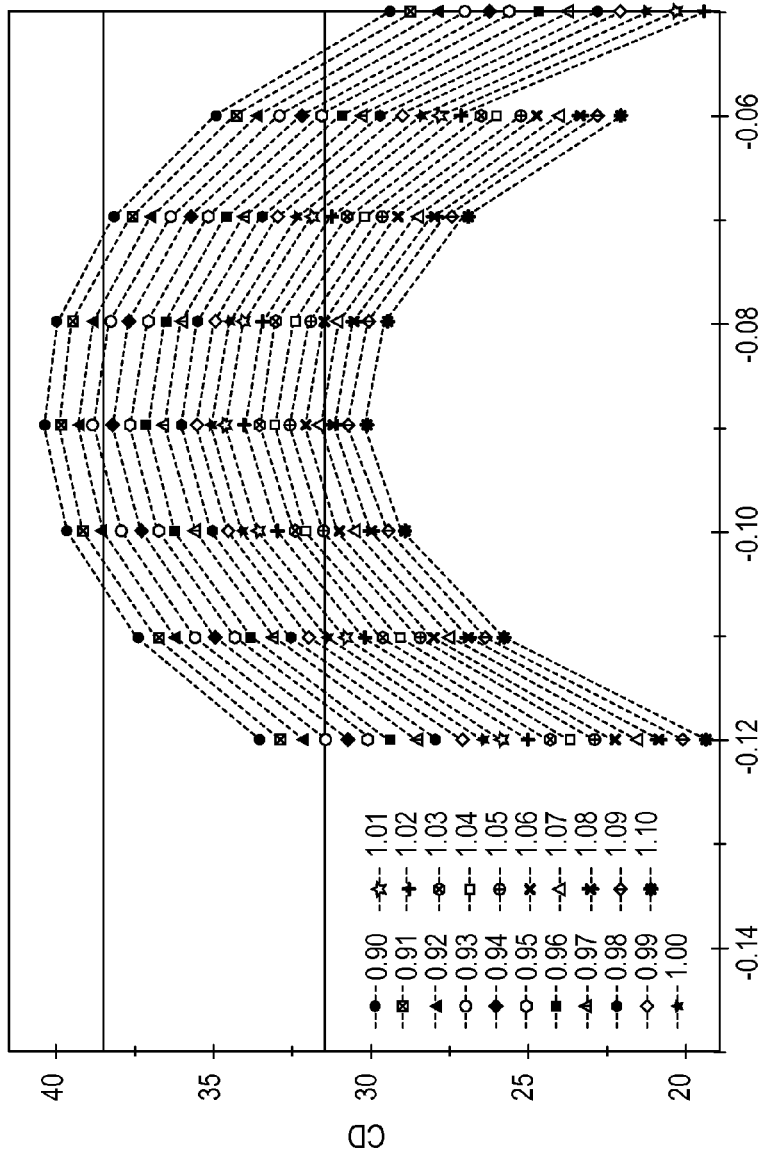

FIGS. 4a and 4b illustrate similar results for exposure latitude. At a pitch of 90 nm, for features having CD of 35 nm, applying the same 100 nm split rule would indicate that the 90 nm features should be split. Comparing FIG. 4a (no split) with 4b (split) shows that this split should not be made, and that exposure latitude would be decreased by splitting.

Figure 5:
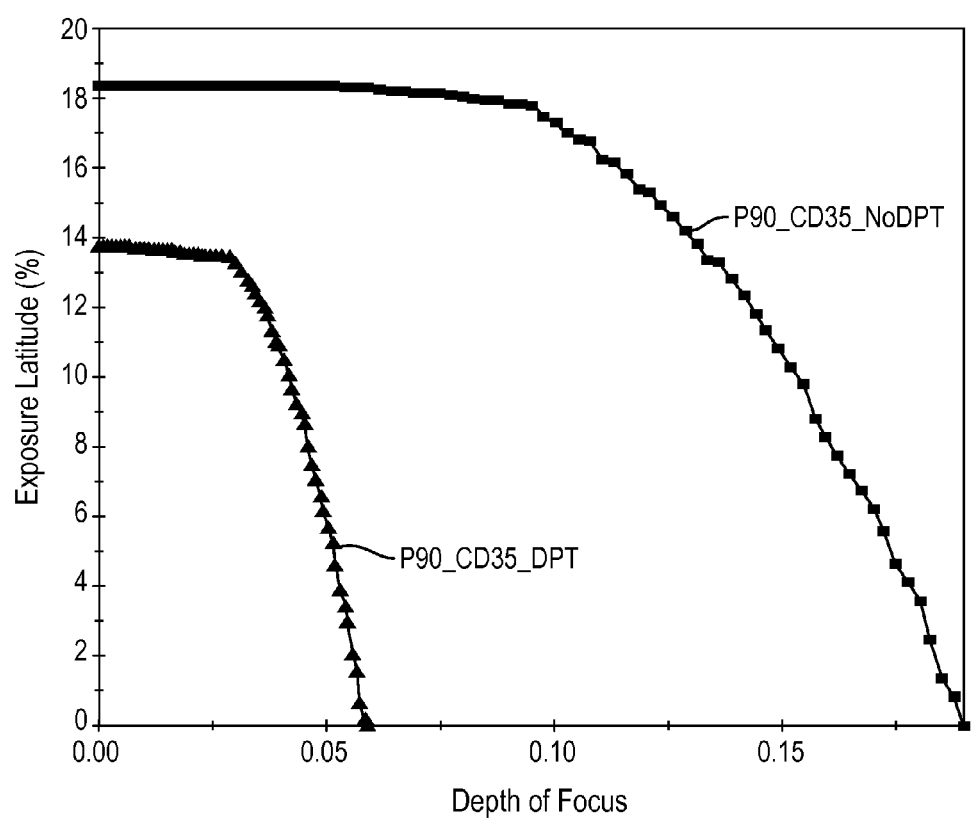
FIG. 5 illustrates exposure latitude (depth of focus v. latitude %) for split (90 nm pitch, 35 nm CD target) and no-split imaging.

FIG. 5 illustrates process window for a 90 nm pitch and 35 nm CD. No split provides a much larger exposure latitude than does a split at this pitch, though the 100 nm rule would hold that this pattern should be split. This is consistent with the conclusion drawn from FIGS. 4a and 4b and FIG. 3

Figure 6A:
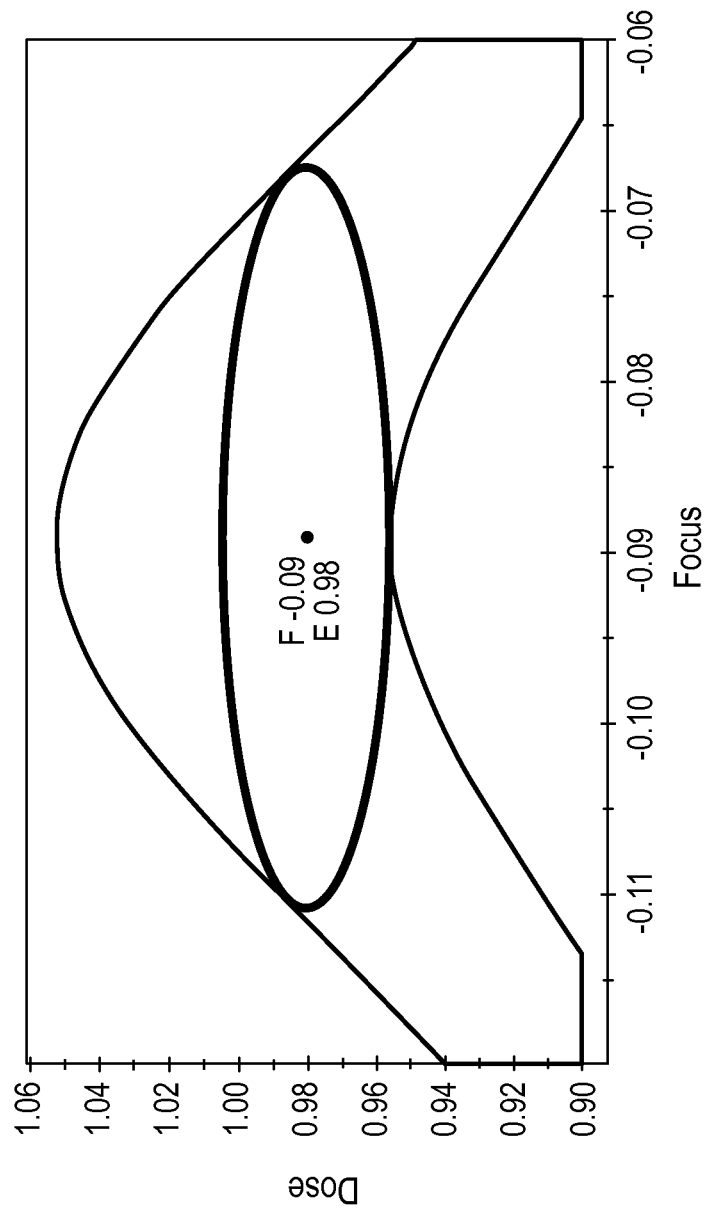
Figure 6B:
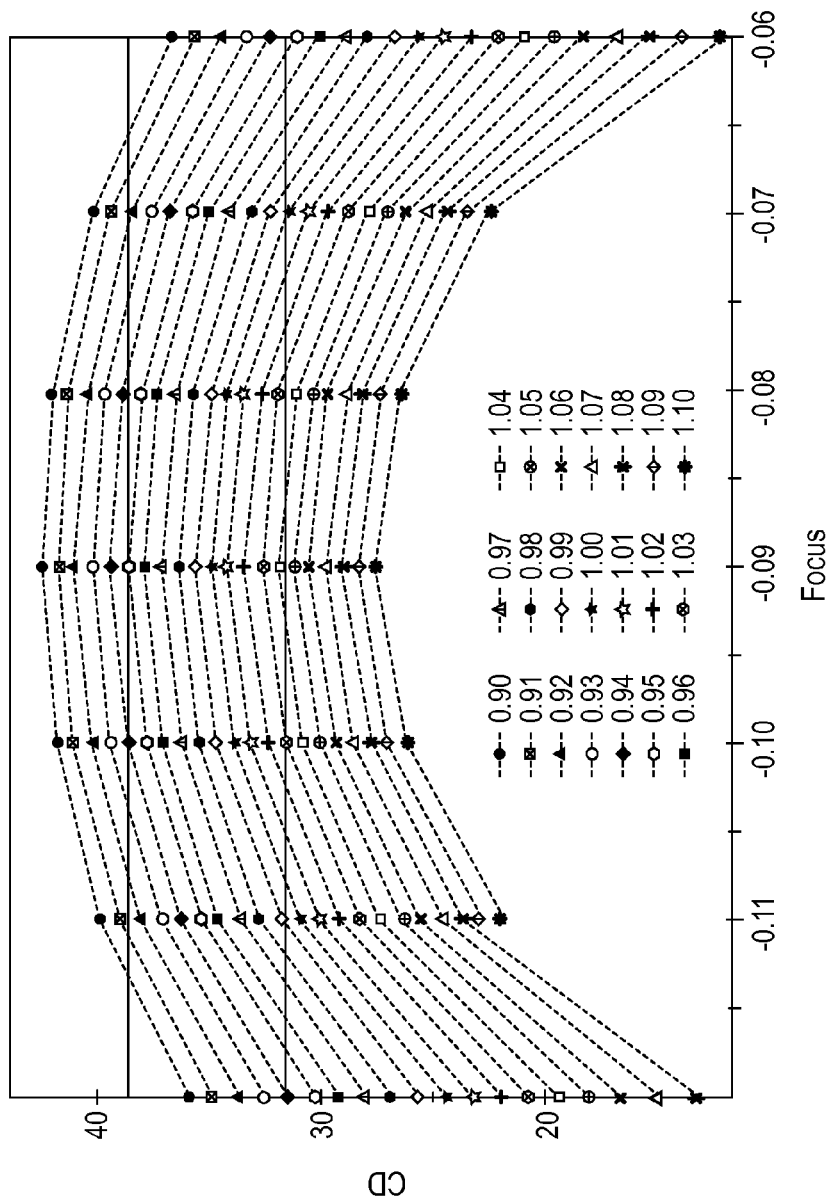
Figure 7:
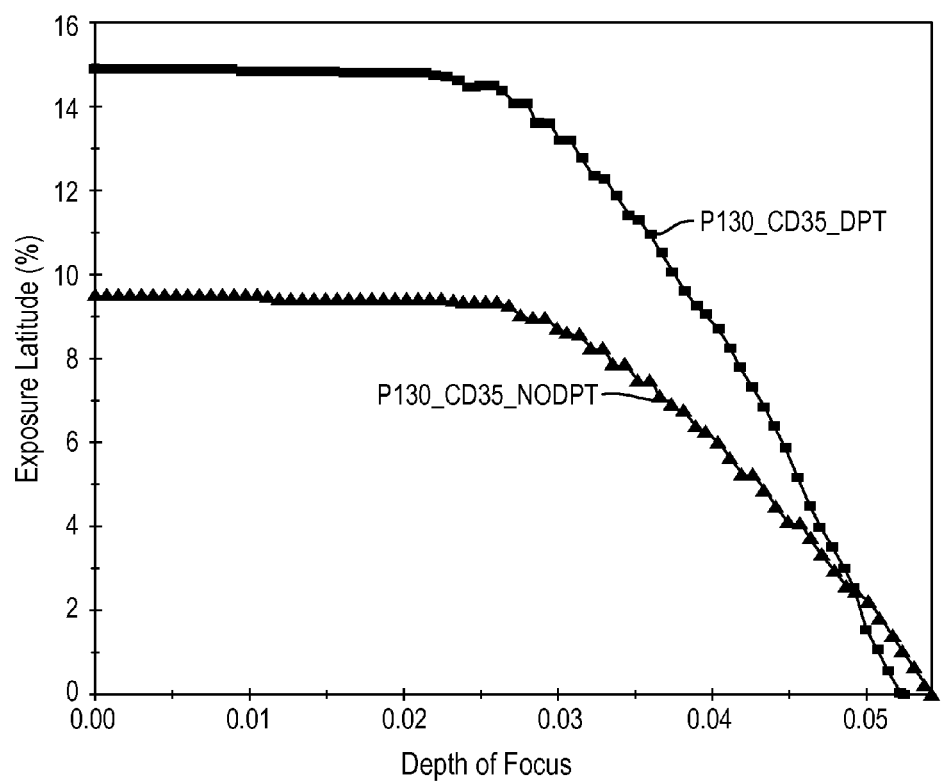
FIG. 7 illustrates exposure latitude (depth of focus v. latitude %) for no-split (130 nm pitch, 35 nm CD target) and split (260 nm pitch, 35 nm CD target) imaging.

The opposite case is shown in FIGS. 6a (no split) and 6b (split) and 7. In these figures, exposure latitude is shown to be greater for the split pattern than for the unsplit pattern for a 130 nm pitch pattern having a 35 nm target CD. This is likewise consistent with FIG. 3 in showing imaging improvement with splitting a pattern having pitch outside the split rule.

In accordance with an embodiment of the invention, a number of test structures are generated. The test structures are varied and simulated aerial image data are generated from the varied test structures. From the simulated image data, splitting rules are formulated, and applied to the design in order to select features for each sub-pattern.

Figure 8A:
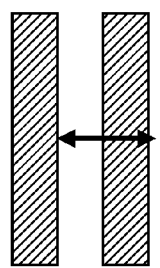
FIGS. 8a-e illustrate examples of a number of test structures and relevant metrics for those structures.
Figure 8B:
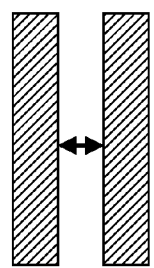
Figure 8C:
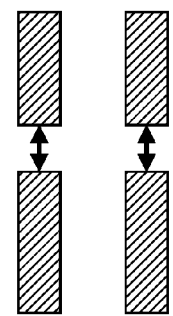
Figure 8D:
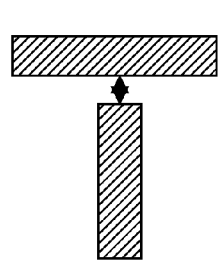
Figure 8E:
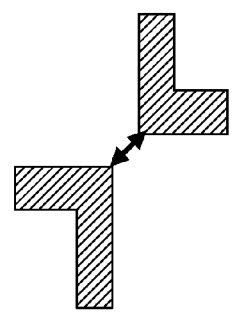

FIGS. 8a-e illustrate a number of test structures that can be used in accordance with an embodiment of the invention, along with dimensions that may be varied for those structures. Examples of variable dimensions include pitch (FIG. 8a), line to line (FIG. 8b), end to end (FIG. 8c), end to line (FIG. 8d), and corner to corner (FIG. 8e).

FIG. 9a illustrates an example of a generated set of features that have been varied for modeling and FIG. 9b is an expanded view of the right hand side feature set of FIG. 9a. In FIG. 9a, pitch increases on an axis from the top to the bottom of the figure. The top-most set of features has a pitch of 62 nm while the bottom most has a pitch of 66 nm.

Figure 10:
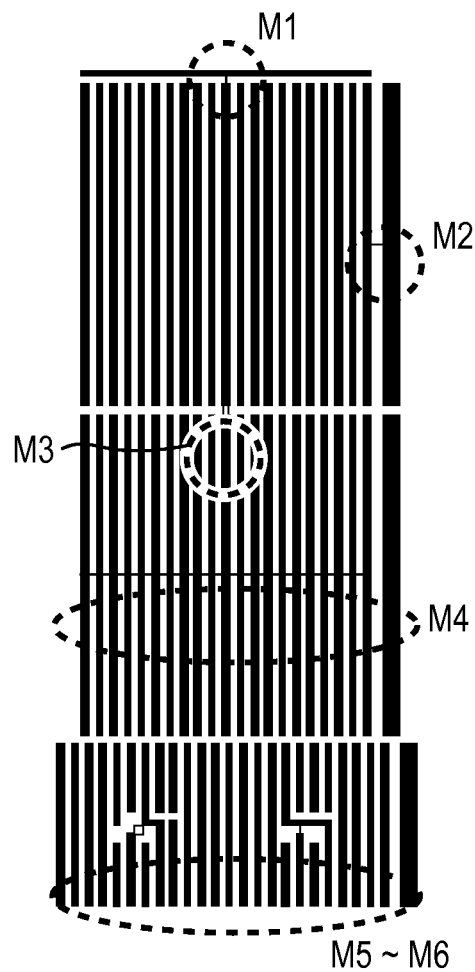
FIG. 10 illustrates a number of metrology sites for use in accordance with an embodiment of the invention.

After running the simulation, a report is generated based on the structure as illustrated in FIG. 10. As can be seen from FIG. 10, there are a number of available metrology sites M1-M6 by which quality of the simulated image may be judged. In the illustrated example, M1 is an end to line region, M2 is a space, M3 is an end to end region, M4 relates to pitch, and M5 and M6 are corner-to-corner regions. As an example, the report may include information for each metrology site relating to position (e.g., coordinates in X and Y), ILS for single exposure and double exposure and both before and after optical proximity corrections have been applied. Finally, where ILS is higher for single exposure, additional ILS measurements may be made for before and after OPC without double exposure techniques.

Figure 11:
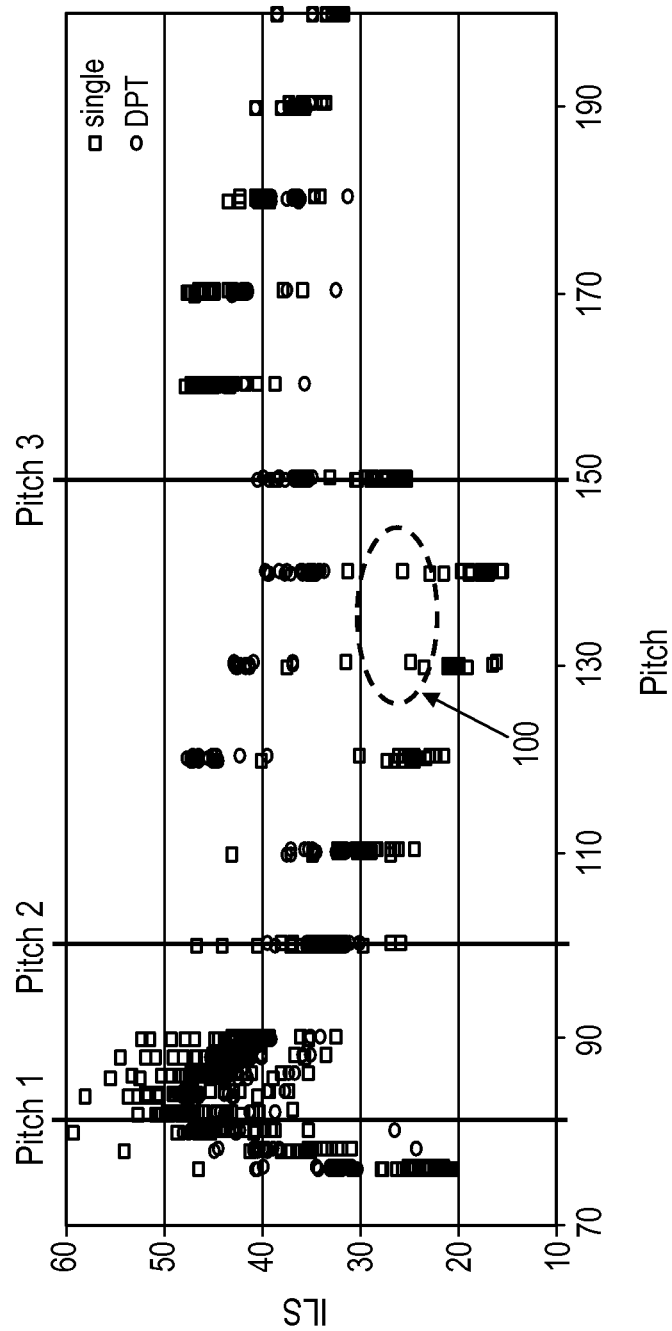
FIG. 11 illustrates ILS simulated data for the M4 metrology site at a variety of pitches.

An example of ILS simulations for M4 test structures is shown in FIG. 11. As may be seen in this Figure, below about 80 nm, DPT provides an ILS improvement. On the other hand, between about 80 and about 100 nm (i.e., between Pitch 1 and Pitch 2), DPT shows a lower ILS than does single exposure. Furthermore, between about 100 and 150 nm, there is improved ILS for DPT, indicating that this region should be split, contrary to the assumptions of the originally proposed 100 nm rule. The region indicated at 100 is the region of lowest ILS, which can be considered to be a "must split" range.

Once these modified rules are determined, the process may proceed by applying optical proximity correction techniques to the pattern and verifying that the derived split rule is correct. The same workflow may be applied to each of the other metrology sites and split rules may be derived for the other split criteria. As necessary, a user may assign a metrology priority such that, for example, end to end performance is more important than corner to corner. As will be appreciated, the prioritized metrology site may depend on the actual structures to be imaged according to the process design and the importance of those structures to the functionality of the final device to be produced.

Figure 12:
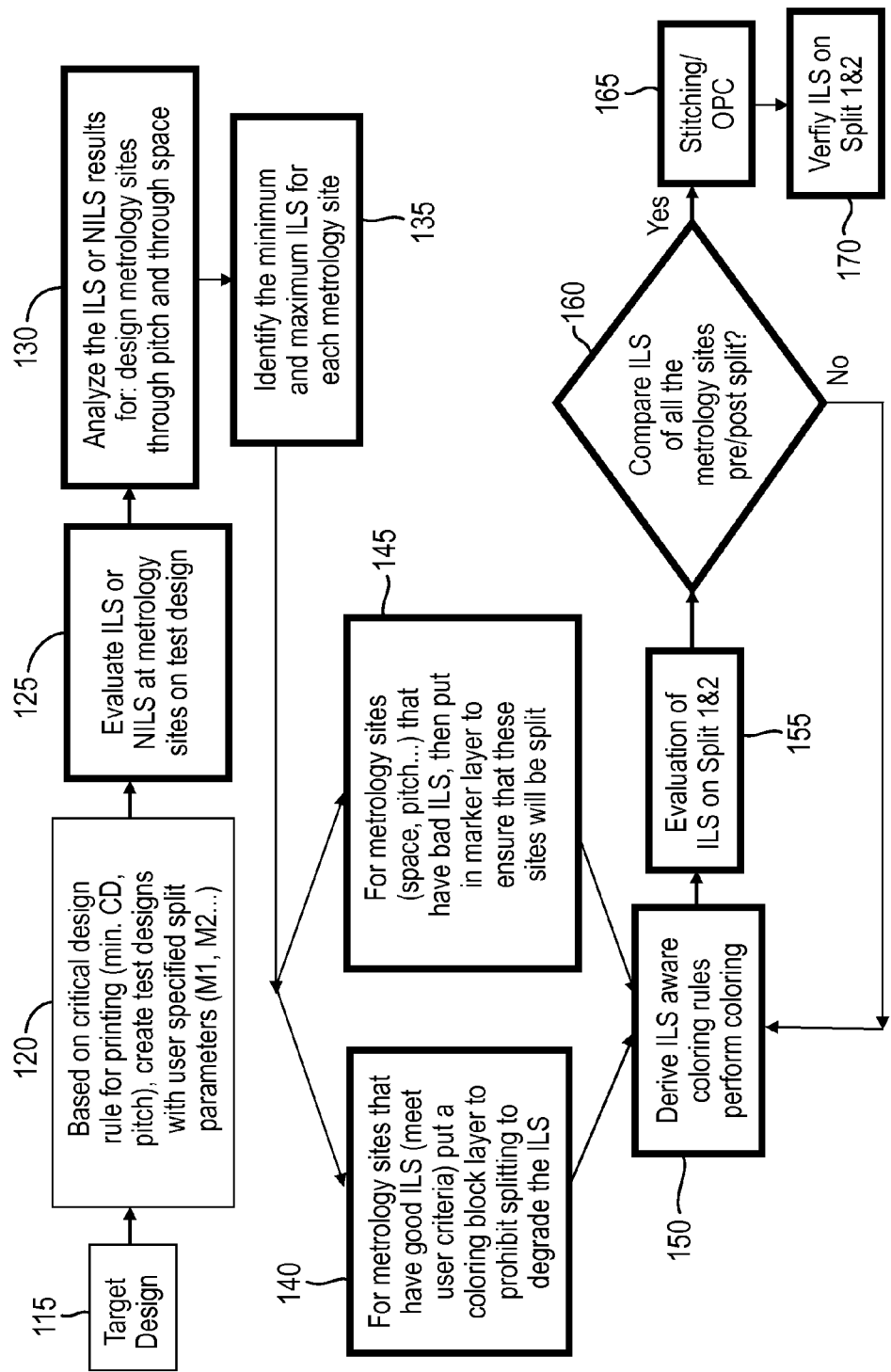
FIG. 12 is a flow chart illustrating a method in accordance with an embodiment of the invention.

FIG. 12 is a flow chart illustrating a typical workflow for a method in accordance with an embodiment of the invention. Beginning with the target design 115, the process moves to the creation of test designs 120 based on, for example, user-specified split criteria parameters. As an example, the parameters may be based on a plurality of metrology positions, $M_1 \ldots M_n$. Using the selected metrology positions, the method proceeds to evaluation of ILS or NILS (for example) 125. Next, the method proceeds to analysis of the results of the evaluation through pitch and through space 130. Based on the analysis, the method proceeds to identification of minimum and maximum ILS (or NILS) 135 for each metrology site.

Once sites are identified, the overall pattern may be divided into sites that meet the criteria are blocked from the application of splitting rules and those that don't meet the criteria which will ensure that they are split according to the splitting rules. In an embodiment, this may include placing a coloring block layer over sites that have better ILS 140 and a marker layer for those sites having relatively poor ILS 145. Once the sites are so divided, application of ILS aware coloring rules may be performed 150. ILS may then be evaluated 155 for the split patterns and ILS of all metrology sites pre- and post-split may be performed 160. If ILS for certain sites is not improved, or is degraded, then control returns to the derivation of coloring rules, and those sites may be excluded from the split operation. Once each site is optimized in accordance with this iterative process, stitching and optical proximity correction elements may be applied 165 to the pattern as desired. After OPC features are included, then ILS may once again be verified 170 on the split patterns.

Figure 13:
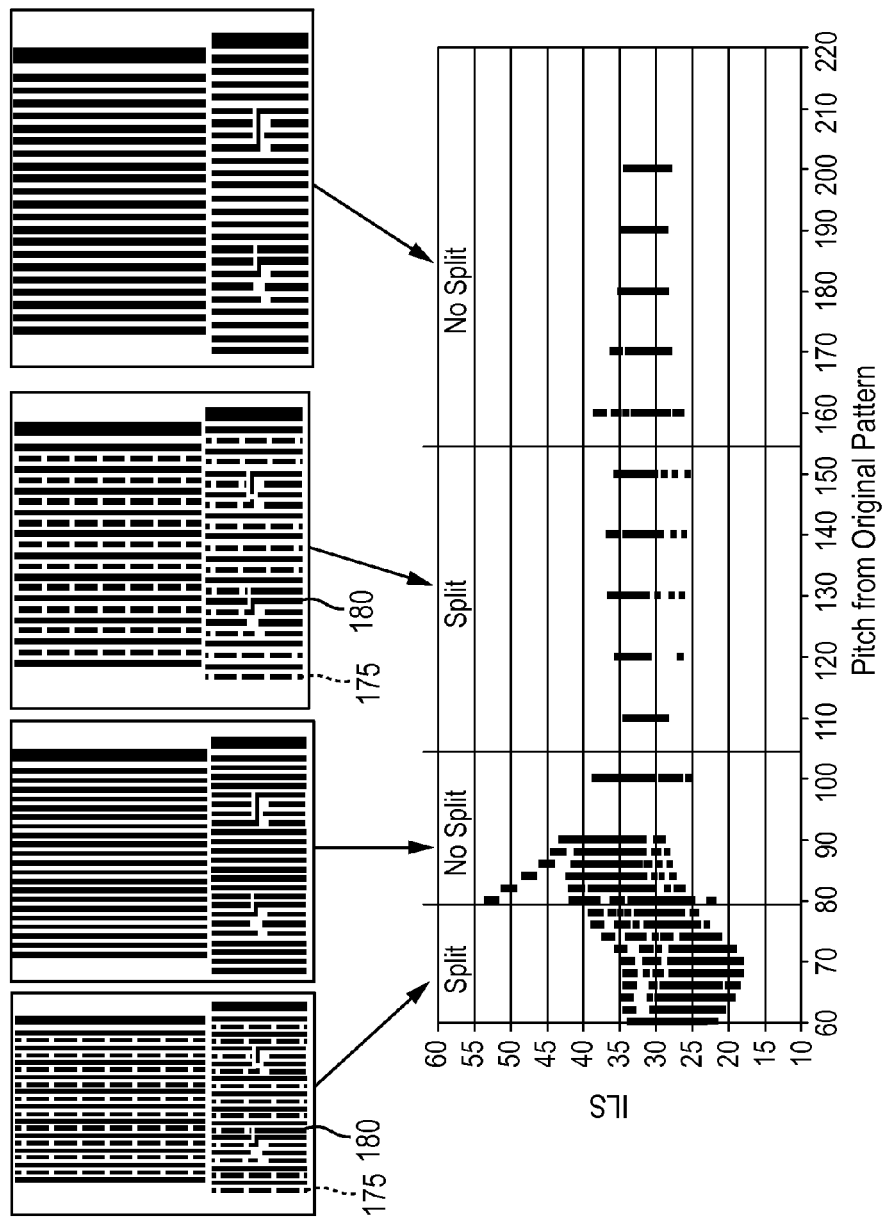
FIG. 13 is an example of a logic standard cell analyzed according to a method in accordance with an embodiment of the invention.

FIG. 13 is an example of an ILS diagram from a standard logic cell split in accordance with an ILS based rule in accordance with an embodiment of the invention. In this illustration, dashed lines 175 represent a first coloring block layer for pattern splitting while solid lines 180 represent the other color in a two pattern split.

Figure 14A:
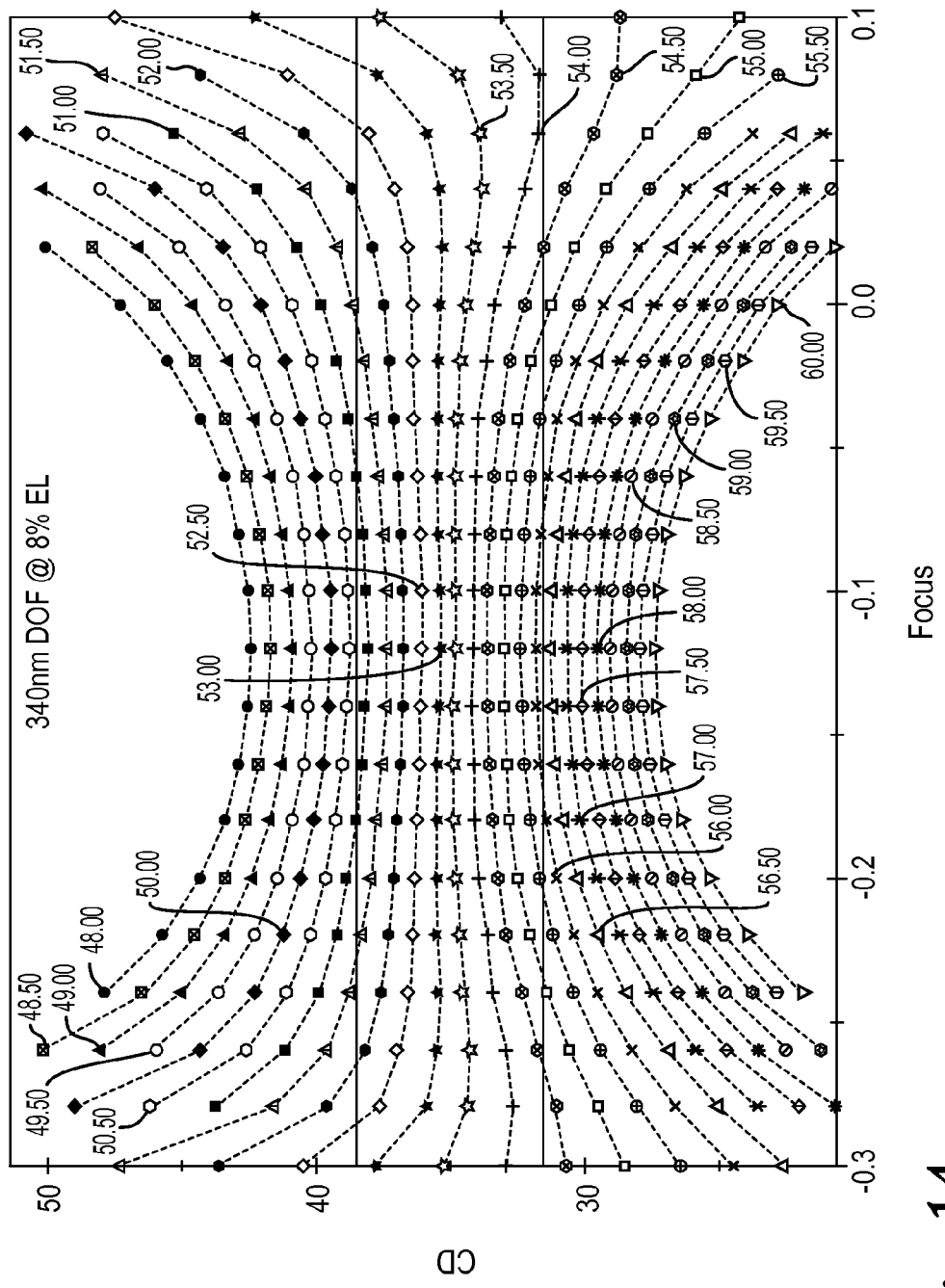
FIGS. 14a-f illustrate process window information for a simulated dense feature imaging process for an 85 nm pitch pattern, along with comparisons of potential split imaging processes.
Figure 14B:
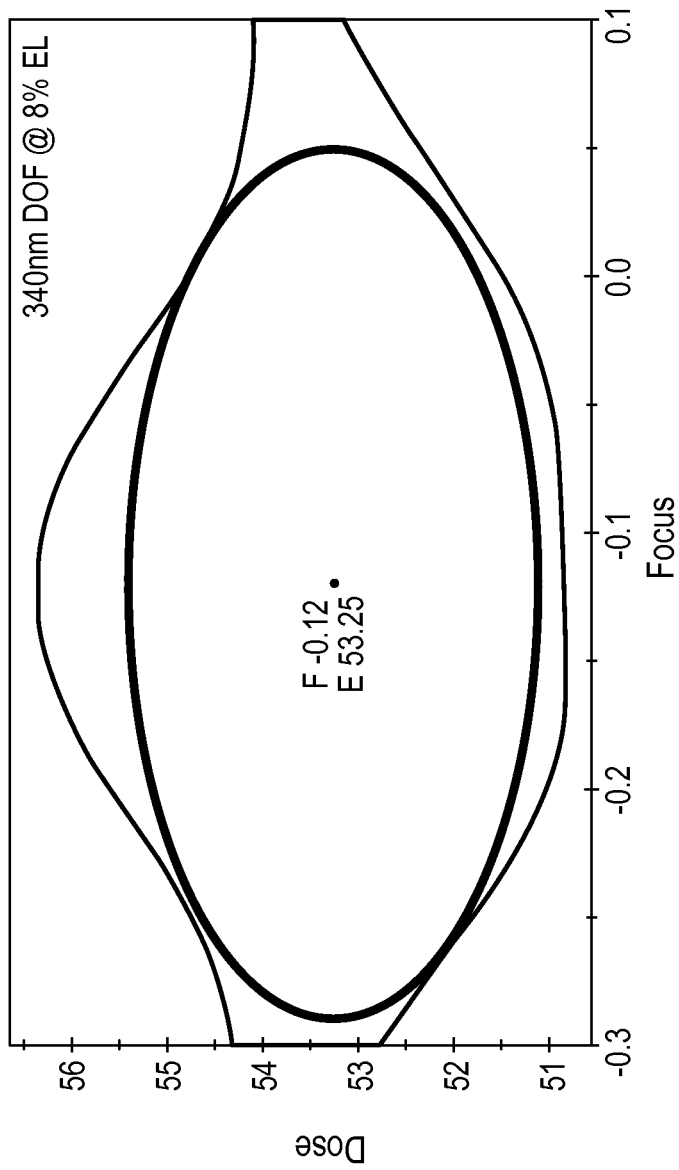

FIGS. 14a-f are illustrations of an example for which splitting tends to reduce the process window, similar to the situation illustrated in FIGS. 4a and 4b and FIG. 5. In this example, FIG. 14a shows a series of Bossung curves for dense feature imaging at an 85 nm pitch (i.e., the pattern illustrated in FIG. 15a). In the FIG. 14a example, the illumination is optimized for dense pitch imaging. The calculated curves show that at an 8% exposure latitude, a depth of focus of 340 nm can be achieved. From the same data, an exposure latitude window as illustrated in FIG. 14b can be developed. As can be seen, the exposure latitude window for the illustrated case is relatively symmetrical and the elliptical process window is fairly large.

Figure 14C:
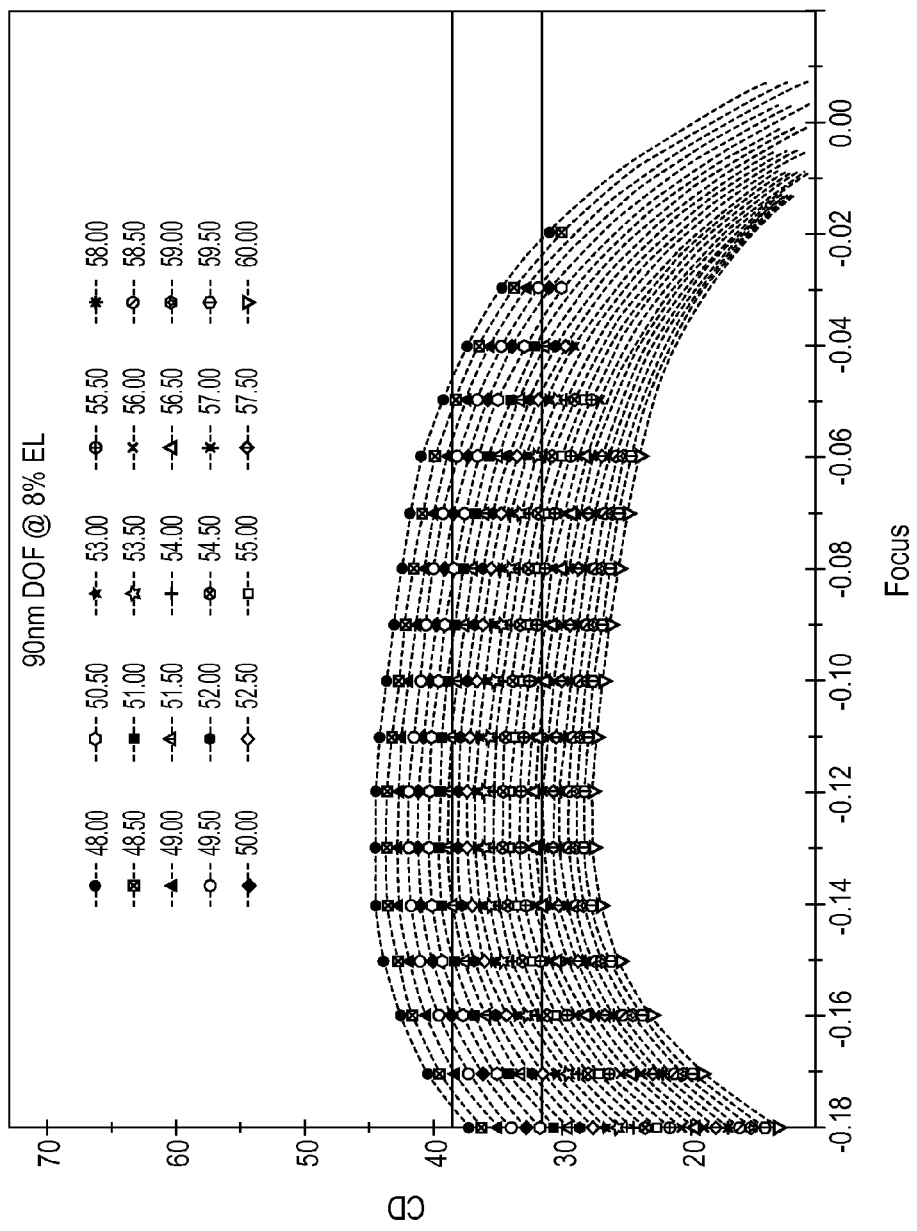
Figure 14D:
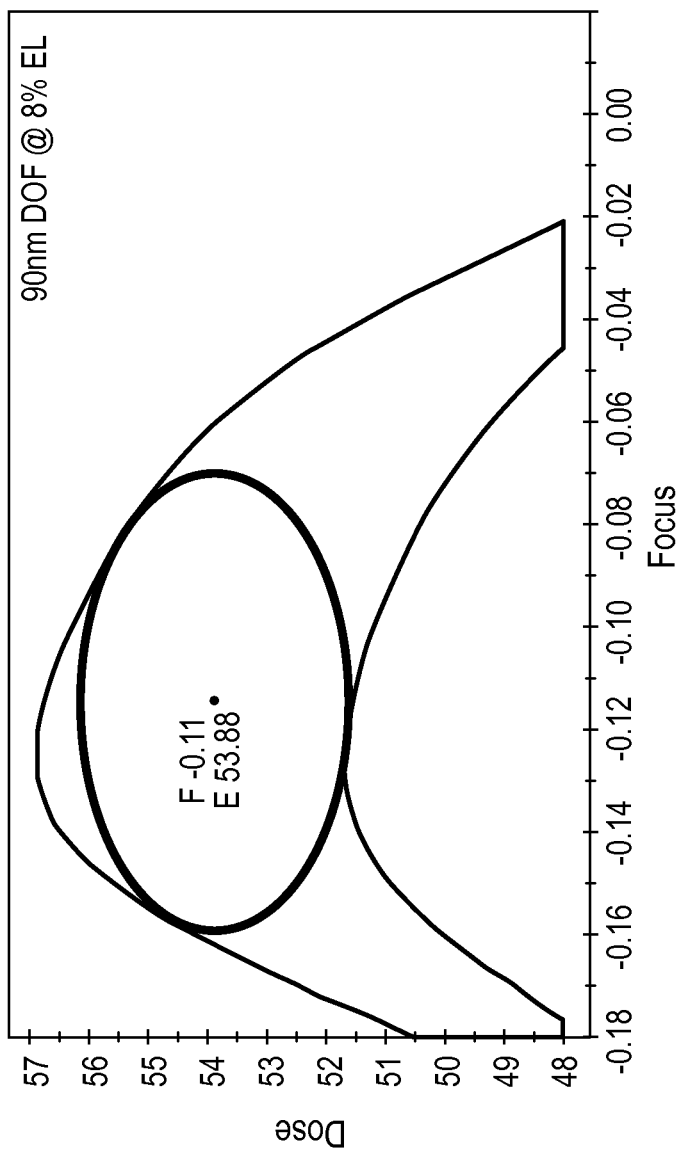
Figure 15A:
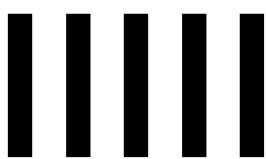
FIGS. 15a-c illustrate patterns as simulated for FIGS. 14a-f.
Figure 15B:

By comparison, the Bossung curves for a split pattern including assist features (170 nm pitch with assist features as illustrated in FIG. 15b) actually results in a degradation of the process window. FIG. 14c shows that the depth of focus at 8% exposure latitude is significantly reduced, to about 90 nm. Likewise, the process window shown in FIG. 14d is somewhat less symmetrical than that of FIG. 14b, and the elliptical process window is considerably smaller in depth of focus, though similar in dose.

Figure 14E:
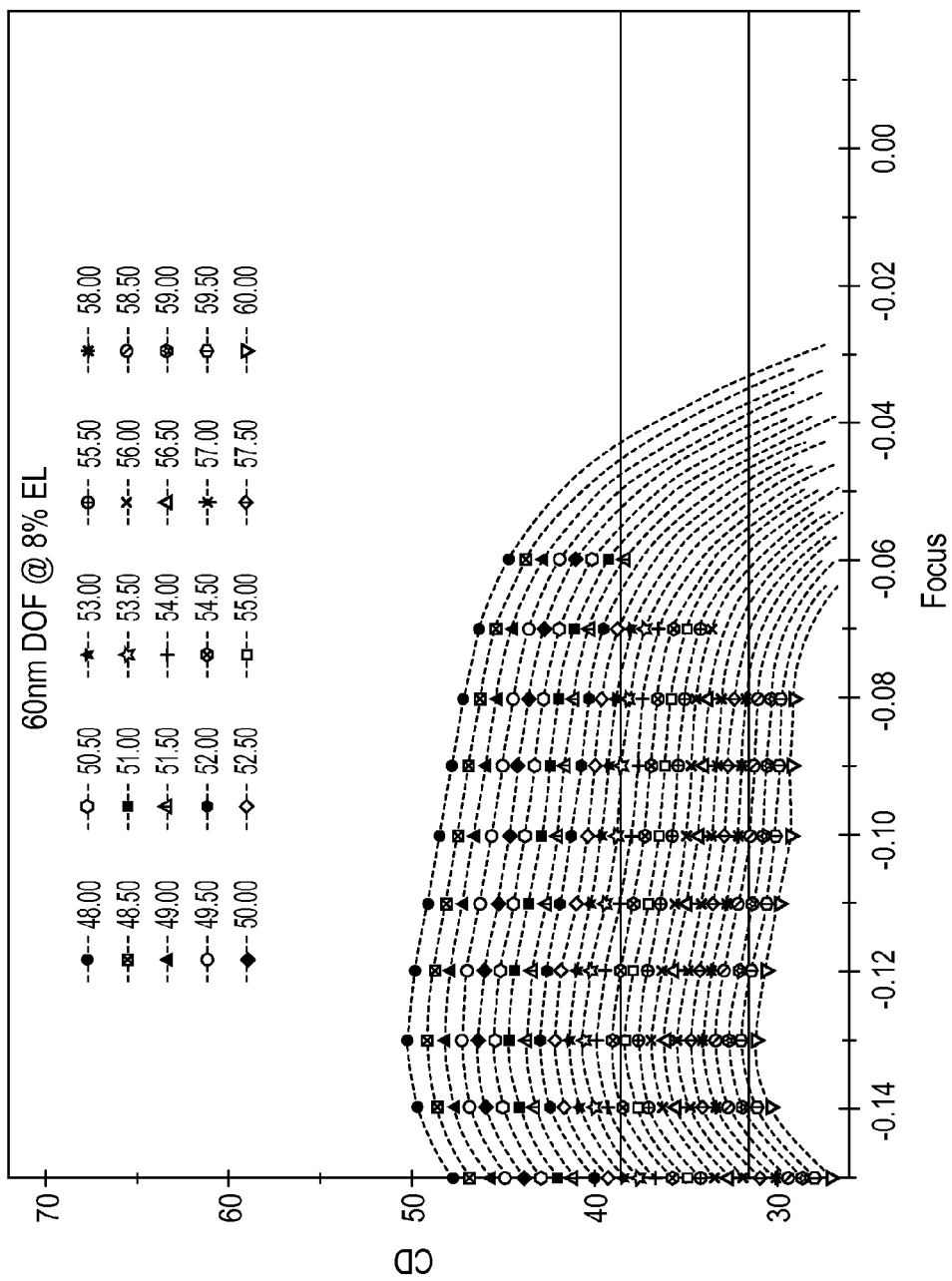
Figure 14F:
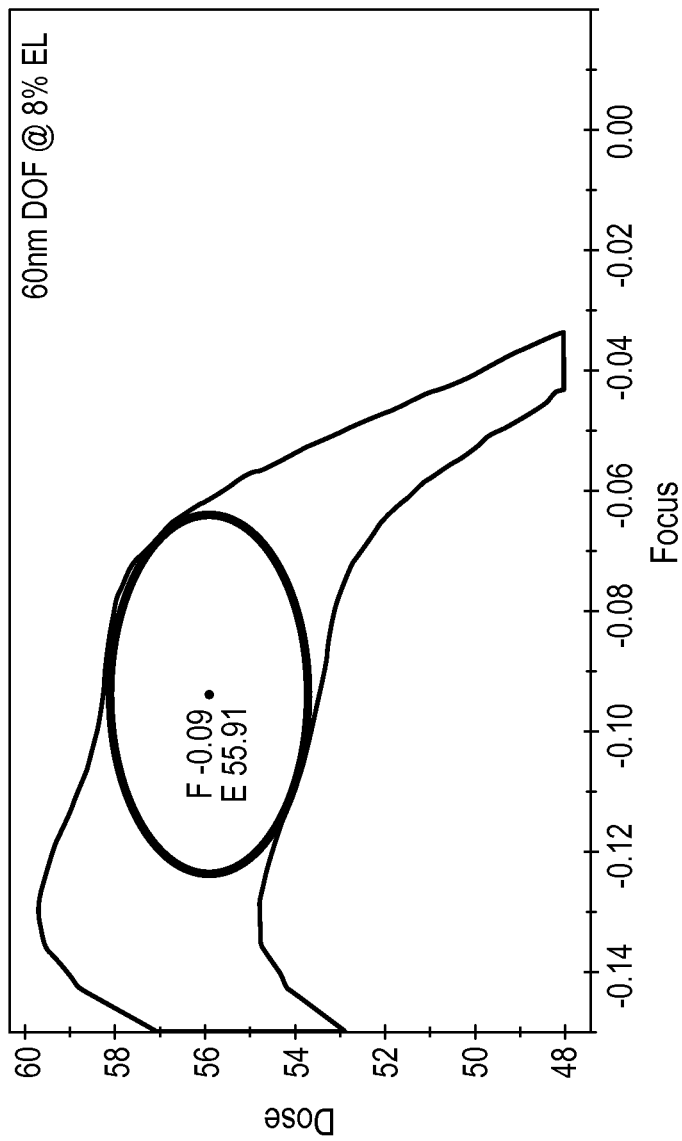
Figure 15C:
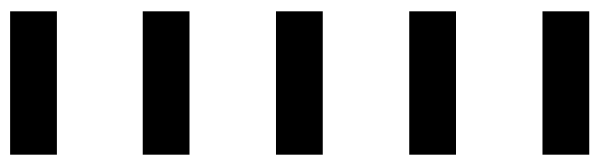

FIGS. 14e and 14f are similar to FIGS. 14c and 14d, but illustrate process window for a split pattern without assist features as illustrated in FIG. 15c. As can be seen, the process window is even less symmetrical than that of the split pattern with assist features. Furthermore, at 8% exposure latitude, achievable depth of focus falls to 60 nm, while dose latitude remains similar to the other two cases. Of additional interest is that the dose required for the example of FIGS. 14e-f is somewhat higher (centered around approximately 56 as opposed to the other two examples, centered around 53.25 and 53.88 respectively). For all three processes, a defocus of around −0.1 maximizes the process window.

In view of the calculated process windows, it is evident that for the particular dense feature imaging of the examples of FIGS. 14a-f, where the dense pitch can be printed with an optimized source in single exposure, an ILS based split rule as described herein should determine that there should be no pattern split, as it would degrade the process window rather than improve it.

In accordance with an embodiment of the invention, the method may be performed by software modules configured to execute the splitting algorithms described herein. The software modules may in turn be embodied in machine executable instructions stored on a machine readable medium. Modules may be configured to perform the splitting algorithms and additional modules, either embodied in a common computing system or embodied in a lithographic apparatus itself, may be configured to operate a lithographic apparatus to perform imaging of devices onto substrates using masks designed in accordance with the methods described herein.

According to an aspect of the invention, an increase of minimum available space between the features of the adapted sub-patterns over minimum available space between features in the desired pattern may be exploited for placement of assist features (i.e., features which do not print such as scatter bars) in an adapted sub-pattern to provide Optical Proximity Correction, whereas such placement would may not have been possible in the desired pattern due to lack of space between features.

In a chip manufacturing process in accordance with an embodiment of the invention, the exposed radiation sensitive layer is subjected to resist-processing to provide the corresponding array of resist-processed features. As a result, an array of features at a desired pitch is obtained. In a particular application, the features may be, for example, contact holes.

While a specific embodiment of the invention has been described above, it will be appreciated that the invention may be practiced otherwise than as described. The description is not intended to limit the invention. For example, though the examples focus on ILS and NILS as measurements of image quality, MEF and other image quality metrics can be used in a similar fashion to determine the appropriate splitting rules to be applied. Furthermore, the method is generally applicable beyond the example of line/space type patterns and can be applied, for example, to contact/via patterns or others.

What is claimed is:

1. A method of splitting a lithographic pattern into a plurality of sub-patterns, comprising:
    generating at least one test structure corresponding to one or more structures of interest in the lithographic pattern;
    varying the at least one test structure through a selected range of dimensions to produce a plurality of varied test structures;
    determining a plurality of values for an image quality metric for images of the plurality of varied test structures;
    analyzing the plurality of values to determine ranges of dimensions for which a pattern split would improve the value of the image quality metric;
    splitting the lithographic pattern into the plurality of sub-patterns of the lithographic pattern in accordance with the determined ranges; and
    manufacturing a mask corresponding to a first sub-pattern of the plurality of sub-patterns.

2. A method as in claim 1, further comprising:
    manufacturing a set of masks, each mask corresponding to one of the sub-patterns of the plurality of sub-patterns.

3. A method comprising imaging the sub-pattern of a mask manufactured by the method of claim 1 onto a light-sensitive layer on a substrate using a photolithographic apparatus.

4. A method as in claim 3, further comprising:
    imaging sub-patterns of at least one additional mask, each additional mask corresponding to a remaining sub-pattern of the plurality of sub-patterns; and
    processing the substrate to develop the imaged sub-patterns such that the lithographic pattern is reproduced in the light-sensitive layer on the substrate.

5. A method as in claim 4, further comprising:
    manufacturing a microelectronic device using the processed substrate and the reproduced lithographic pattern.

6. A method as in claim 1, wherein the image quality metric comprises ILS.

7. A method as in claim 1, wherein analyzing further includes determining an effect on a process window for a lithographic process for imaging the lithographic pattern.

8. A method as in claim 1, wherein the images comprise simulated images.

9. A method as in claim 7, wherein the images comprise simulated images, and wherein determining the plurality of values includes generating the simulated images of the plurality of varied test structures using a model of the lithographic process.

10. A method as in claim 1, further comprising, after analyzing the plurality of values, modifying pattern split rules, wherein splitting is performed using the pattern split rules.

11. A method as in claim 1, wherein determining is performed at metrology sites corresponding to structures of interest in the lithographic pattern.

12. A method as in claim 9, wherein determining is performed at metrology sites in the simulated images corresponding to the structures of interest in the lithographic pattern.

13. A mask for imaging a lithographic pattern, the mask comprising:
    a sub-pattern of the lithographic pattern, wherein the sub-pattern is one of a plurality of sub-patterns into which the lithographic pattern has been split, and wherein a determination of how the lithographic pattern is split comprises:
    generating at least one test structure corresponding to one or more structures of interest in the lithographic pattern:
    varying the at least one test structure through a selected range of dimensions to produce a plurality of varied test structures;
    determining a plurality of values for an image quality metric for images of the plurality of varied test structures;
    analyzing the plurality of values to determine ranges of dimensions for which a pattern split would improve the value of the image quality metric; and splitting the lithographic pattern into the plurality of sub-patterns of the lithographic pattern in accordance with the determined ranges.

14. A set of masks for imaging a lithographic pattern, the set of masks comprising:
  a respective mask for each of a plurality of sub-patterns into which the lithographic pattern has been split, and wherein a determination of how the lithographic pattern is split comprises:
  generating at least one test structure corresponding to one or more structures of interest in the lithographic pattern;
  varying the at least one test structure through selected range of dimensions dimensions to produce a plurality of varied test structures;
  determining a plurality of values for an image quality metric for images of the plurality of varied test structures;
  analyzing the plurality of values to determine ranges of dimensions for which a pattern split would improve the value of the image quality metric; and
  splitting the lithographic pattern into the plurality of sub-patterns of the lithographic pattern in accordance with the determined ranges.

\* \* \* \* \*